United States Patent [19]

Hadley et al.

[11] Patent Number: 4,751,705
[45] Date of Patent: Jun. 14, 1988

[54] SINGLE-ELEMENT OPTICAL INJECTION LOCKING OF DIODE-LASER ARRAYS

[75] Inventors: G. Ronald Hadley; John P. Hohimer; Adelbert Owyoung, all of Albuquerque, N. Mex.

[73] Assignee: The United States of America as represented by the United States Department of Energy, Washington, D.C.

[21] Appl. No.: 916,344

[22] Filed: Oct. 7, 1986

[51] Int. Cl.$^4$ .............................................. H01S 3/098
[52] U.S. Cl. ........................................ 372/18; 372/24; 372/50
[58] Field of Search ....................... 372/18, 24, 19, 20, 372/50

[56] References Cited

U.S. PATENT DOCUMENTS

| | | | |
|---|---|---|---|
| 3,541,471 | 11/1970 | Kaminow et al. | 331/94.5 |
| 3,626,321 | 12/1971 | Smith | 331/94.5 |
| 3,691,483 | 9/1972 | Klein | 372/18 |
| 3,992,682 | 11/1976 | White et al. | 372/24 |
| 4,219,785 | 8/1980 | Scifres et al. | 372/24 |
| 4,677,629 | 6/1987 | Lesh | 372/18 |
| 4,686,485 | 8/1987 | Goldberg et al. | 372/18 |

OTHER PUBLICATIONS

Goldberg et al; "Injection Locking . . . Arrays"; Appl. Phys. Lett. 46(3), Feb. 1, 1985; pp. 236–238.
L. Goldberg et al., "Injection Locking of Coupled-Stripe Diode Laser Arrays", Applied Physics Letters, vol. 46, No. 3, Feb. 1, 1985, pp. 236–238.
G. R. Hadley et al., "Single Channel Injection Locking of a Diode-Laser Array with CW Dye Laser", App. Physics Letters, vol. 47, No. 12, pp. 1244–1246, Dec. 15, 1985.
G. R. Hadley et al., "Modeling of Injection–Locking Phenomena in Diode-Laser Arrays", Optics Letters, vol. 11, No. 3, pp. 144–146, Mar. 1986.
G. R. Hadley et al., "Interelement Coupling in Gain-Guided Diode Laser Arrays, Appl. Physics Letters, vol. 48, No. 22, pp. 1504–1506, Jun. 2, 1986.
S. Kobayashi et al., "Injection Locking Characteristics of a AlGaAs Semiconductor Laser", IEEE Journal of Quantum Electronics, vol. QE-6, No. 9, pp. 915–917, Sep. 1980.
S. Kobayashi et al., "Injection Locking in AlGaAs Semiconductor Laser", IEEE Journal of Quantum Electronics, vol. QE-17, No. 5, pp. 681–689, May 1981.
R. Wyatt et al., "Megahertz Linewidth from a 1.5 μm Semiconductor Laser with HeNe Laser Injection", Electronics Letters, vol. 18, No. 7, pp. 292–293, Apr. 1, 1982.
J. E. Eppler et al., "Transverse Modes of Gain-Guided Coupled-Stripe Lasers: Extended Cavity Control of the Emitter Spacing", Applied Physics Letters, vol. 47, No. 1, pp. 7–9, Jul. 1, 1985.
G. R. Hadley, "Numerical Simulation of Injection-Locking of Diode Laser Arrays", Optical Soc. of America, 1985 Annual Mtg., p. 12, Washington, DC, Oct. 14–18, 1985 (Abstract of Speech).
J. P. Hohimer et al., "Injection-Locking Diode Laser Arrays with a Stable Single-Mode CW Dye Laser", Optical Soc. of America, 1985 Annual Mtg., p. 12, Washington, DC, Oct. 14–18, 1985 (Abstract of Speech).
G. R. Hadley et al., "Free-Running Modes for Gain-Guided Diode Laser Arrays", Conf. on Lasers & Electrooptics (CLEO), San Francisco, CA, Jun. 9–13, 1986 (Abstract of Speech).
J. P. Hohimer et al., "Use of Injection Locking to Study Coupling Behavior in Gain-Guided Diode-Laser Arrays", Conf. on Lasers & Electrooptics (CLEO), San Francisco, CA, Jun. 9–13, 1986 (Abst. of Speech).

Primary Examiner—James W. Davie
Assistant Examiner—Xuan T. Vo
Attorney, Agent, or Firm—Anne D. Daniel; James H. Chafin; Judson R. Hightower

[57] ABSTRACT

By optically injecting a single end-element of a semiconductor laser array, both the spatial and spectral emission characteristics of the entire laser array is controlled. With the output of the array locked, the far-field emission angle of the array is continuously scanned over several degrees by varying the injection frequency.

13 Claims, 4 Drawing Sheets

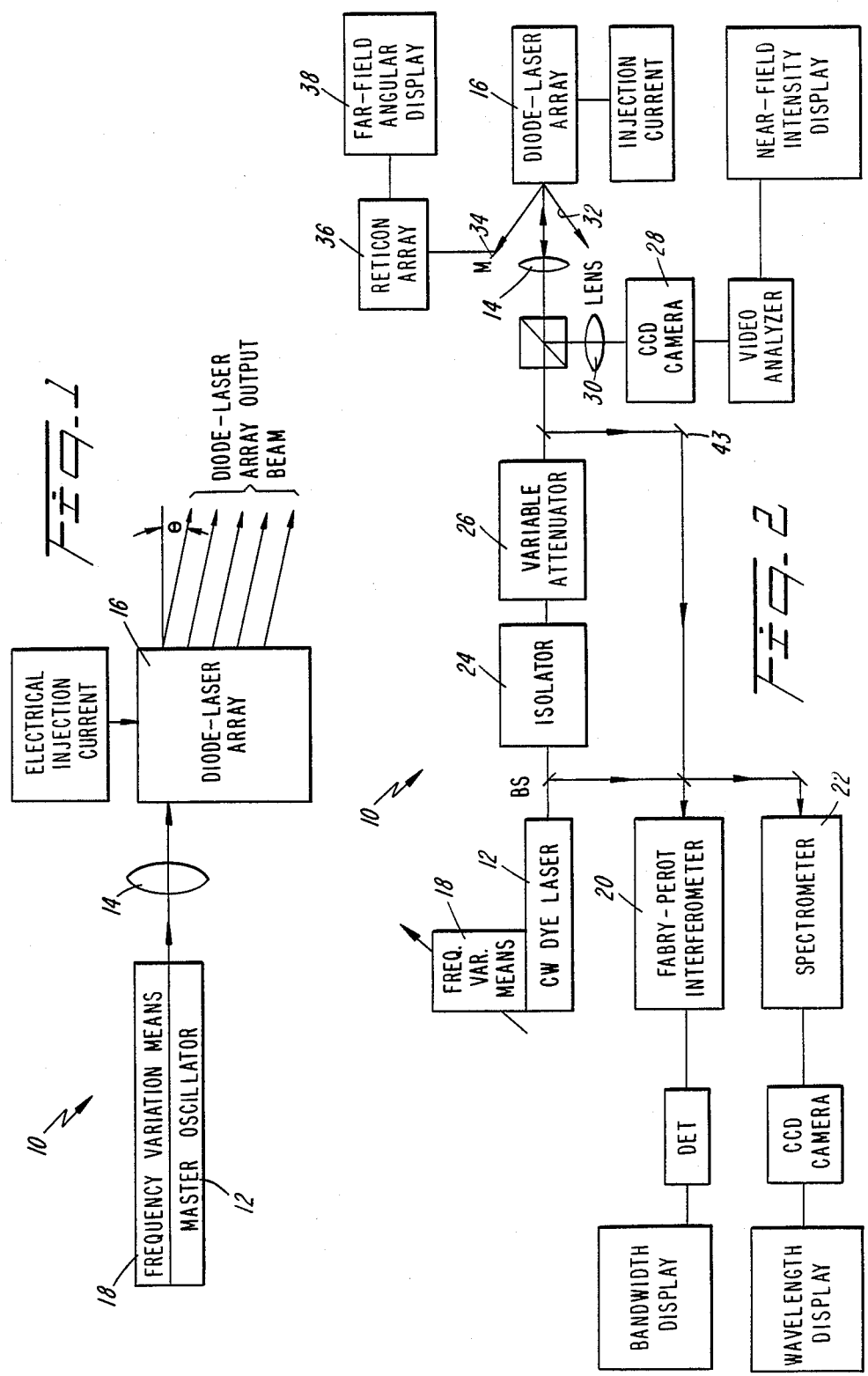

SINGLE-ELEMENT OPTICAL INJECTION LOCKING OF DIODE-LASER ARRAYS

The United States Government has rights in this invention pursuant to Contract No. DE-AC04-76DP00789 between the United States Department of Energy and Sandia National Laboratories.

FIELD OF THE INVENTION

The present invention relates to the field of control of laser beam radiation, and more particularly to a method of and apparatus for controlling the spatial and spectral emission of a laser beam from a semiconductor laser array.

BACKGROUND OF THE INVENTION

The substantial potential for high-power continuous wave and pulsed lasing in coherently coupled diode-laser arrays has led to considerable interest in their development. Attention has focussed on the problem of controlling the spatial emission characteristics of these devices with the aim of promoting single-lobed far-field emission patterns. The approaches most often used entail a 'chriping' of the gain profile across the device by varying the stripe widths or the spacing between strips. Alternatively, such a spatially chirped gain has also been realized by fabrication of a diode-laser array structure in which the gain of each stripe could be independently controlled via separate current contacts. Although the above approaches have demonstrated some degree of success in producing single-lobed far-field patterns, they provide no improvement in the spactral characteristics of the devices, which in the case of gain-guided arrays, oscillate in several longitudinal modes.

Semiconductor diode-laser arrays provide an intense and efficient source of laser radiation. However, these devices have two inherent drawbacks which limit their usefulness. They generally emit their radiation in a two-lobed far-field pattern which makes beam focusing and/or propagation difficult, and the spectral distribution of their emission is spread over many angstroms. In addition, it is difficult to cause the output of the laser array to scan even a limited field.

Injection-locking is well known for controlling the spectral distribution of single-channel diode lasers. Furthermore, control of both the spectral and spatial distribution of diode-laser arrays has been demonstrated using a single-frequency diode laser as the master oscillator. In L. Goldberg, H. F. Taylor, J. F. Weller, and D. R. Scifres, "Injection-Locking of Coupled-Stripe Diode Laser Arrays", Applied Physics Letters, 46, 236 (1985), injection locking is applied to a diode laser array to control the spatial profile of light emitted by the array. Because all the elements of the array are injected uniformly, injection is applied to the array at an angle of 4 degrees off the array axis in order to produce a phase tilt across the array leading to emission in a single beam.

As the injection array frequency was varied, a frequency interval (locking bandwidth) was observed over which the single-lobed emission from the array could be maintained. When a single element of the array was injected (again at an angle of 4 degrees to the array axis), there was a much smaller locking range (less than 1 GHz). There was not, however, any reference to or realization of scanning of the emission beam from an injection-locked array by varying the injection frequency of the array.

Previously, it has been observed that by incorporating a semiconductor laser array into a cavity containing a grating as a tuning element, the emission angle of the two-lobed far-field beam changes as the grating is tuned. In this case the far-field beam consists of two-lobes of nearly equal intensity centered about the axis of the diode-array with the result that there was no net angular steering of the total beam. The prior art does not disclose scannable optical injection of radiation for steering the emission of a single-lobed far-field diode laser beam.

Various means of scanning laser beam output using the input frequency as a medium to bring about the scan are known. For example, in U.S. Pat. No. 3,541,471 to Kaminow et al, scanning is limited to a fixed frequency which requires the scanning frequency to be equal to the transverse mode separation frequency.

Generally in such systems, separate phase modulators and/or frequency shifters are required. These separate external or intracavity phase modulators and/or frequency shifters are undesirable since they introduce additional losses in the optical power available and require additional components and circuitry to monitor and control their performance.

In U.S. Pat. No. 3,691,483 to Klein, phase control is integrated into the semiconductor structure itself. However, the use of a separate electrical input signal to control the relative phase shift of each laser in the array and a computer to synchronize and control the overall phase tilt of the array are required.

In U.S. Pat. No. 3,626,321 to Smith and in U.S. Pat. No. 3,691,483 to Klein, generation of multiple input beams, together with associated mirrors or optical distributors as required to generate the multiple input beams, is disclosed.

In general, it is desirable to scale up the diode laser array to a very large number of emitting elements (in the form of a one- or two-dimensional array). This scaling is very difficult and costly, if not impossible, with the prior art. In U.S. Pat. No. 3,626,321 to Smith, for example, a plurality of laser beams are generated by means of interference effects, and the intensity of any one beam is therefore correspondingly reduced.

In U.S. Pat. No. 3,541,471 to Kaminow et al, the spatial intensity profile of the emitted beam varies with the scan angle since the selection of the transverse modes which are excited is angle depenent. Such dependence of spatial intensity of the emitted laser beam upon the scan angle is undesirable.

SUMMARY OF THE INVENTION

Accordingly, it is a primary object of the present invention to provide an apparatus and method for optically steering the output beam from a diode-laser array and for scanning the beam over an angle of several degrees.

Another object of the invention is to provide a technniue involving optical injection of radiation for steering the emission of a single-lobed far-field laser beam.

Another object is to provide a system for optically injected diode laser scanning which is not limited to a fixed frequency.

Still another object of the invention is to provide an optically injected diode laser scanning system wherein the separate phase modulators and/or frequency shifters required in the prior art are eliminated.

An additional object of the invention is to permit scaling of the diode laser array to a very large number of emitting elements (in the form of a one- or two-dimensional array) which requires only one or at the most a very few master oscillators to control the performance of the array.

Another object of the invention is to provide a laser beam whose spatial intensity profile is relatively insensitive to the angle of emission of the laser beam.

Additional objects, advantages, and novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out in the appended claims.

To achieve the foregoing and other objects, and in accordance with the purposes of the present invention as described herein, an improved apparatus and method are provided not only to control the spectral and spatial distribution of the output of diode-laser arrays, but also to steer the output beam from a diode-laser array and to scan it over an angle of several degrees. This ability to optically control the beam angle of diode-laser arrays opens up the possibility of high-speed direct optical or electronic scanning and pointing of high-power diode-laser arrays without the need for mechanical or electro-optical scanning elements.

In accordance with the invention, to achieve mode control and beam steering in a diode-laser array, the optical radiation emitted by a frequency tunable master optical oscillator (for example a narrow band tunable continuous wave dye laser which has a bandwidth of less than 2 MHz and which is electronically scannable over many tens of gigahertz) is injected into a single end-element of a multi-element gain-guided semiconductor diode-laser array. By injecting a single end-element, the emission of the entire array can be locked. This locking narrows the emission bandwidth of the array from several longitudinal modes spread over hundreds of gigahertz to a single longitudinal mode with a very narrow emission bandwidth (less than 2 MHz for injection with a narrow band dye laser master oscillator).

In accordance with another aspect of the invention, the angle scanning of the diode-laser array can be accomplished electronically by maintaining a fixed optical injection frequency from the master oscillator and varying the electric current supplying the diode-laser array.

In accordance with the above embodiment of the invention, a single end-element of a diode laser array is optically injected along the array axis. In this manner, the array is forced to emit in a single beam. Furthermore, with this method, the phase tilt across the entire array can be controlled and varied simply by changing the frequency of the injected radiation.

BRIEF DESCRIPTION OF THE DRAWINGS

The accompanying drawings incorporated in and forming a part of the specification, illustrate several aspects of the present invention, and, together with the description, serve to explain the principles of the invention. In the drawings:

FIG. 1 shows a block diagram for a system in accordance with the invention for optical injection of a diode-laser for beam steering;

FIG. 2 shows a block diagram for the system of the invention that was employed to obtain the graphs in FIGS. 3A–3D, 4, 5, and 6;

DETAILED DESCRIPTION OF A PREFERRED EMBODIMENT OF THE INVENTION

Figures 3A, 3C:
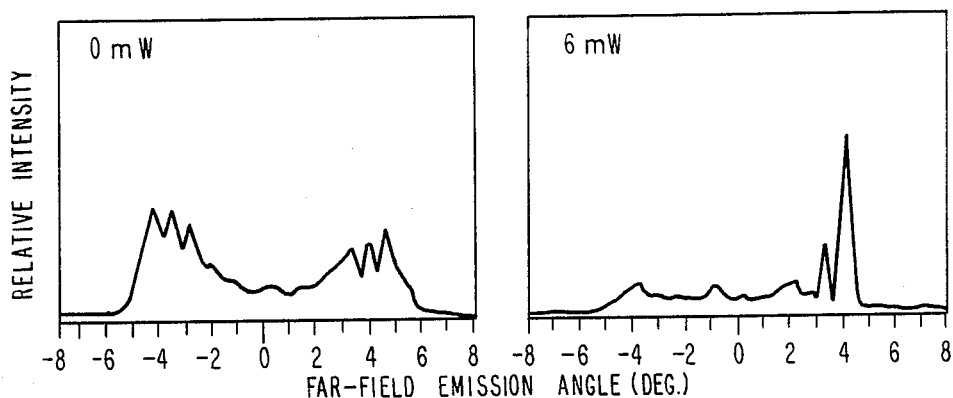
FIGS. 3A–3D are graphs depicting angular distribution of far-field emission at various injected power levels in the range of 0–12 mW for a semiconductor laser array. A free-running array, i.e., no optical injection, corresponds to 0 mW.

Reference is made to the block diagram of FIG. 1 wherein system 10 of the invention, shown in an overview, is comprised of a controlled variable master optical oscillator 12 that applies an output signal through a focussing lens 14 to a semiconductor diode laser array 16. A source 17 of injection current is applied to the array 16.

The block diagram of FIG. 2 details a system to record a variety of system parameters obtained in accordance with the invention. Master oscillator 12 in the preferred embodiment is a frequency-stabilized continuous wave dye laser (Coherent, Model 599-21, with LD700 dye) with a measured linewidth of less than 2 MHz. The dye laser is pumped with the red output from a krypton ion laser. Oscillator 12 alternatively may be any other suitable type of laser, such as a semiconductor laser diode or color-center. Furthermore, the oscillator 12 may be provided by a pulsed as well as continuous wave laser. Scanning Fabry-Perot interferometers 20 (150 MHz and 1.5-GHz free-spectral-ranges) and a 1-meter spectrometer are used to monitor the optical injection bandwidth and wavelength. Isolation between the dye laser 12 and the diode-laser array 16 is provided by a permanent-magnet Faraday isolator 24. The intensity of the injected beam can be continuously varied without affecting either the dye laser 12 or the location of the focal spot on the diode array 16 emission surface by using a variable attenuator 26 consisting of a polarization rotator and a linear polarizer. A 12-mm-focal-length lens 14 is then used to focus this beam onto the selected facet of the diode-laser array 16. Alternatively, an optical waveguide can be applied for this purpose.

The injection of radiation from the dye laser 12 into the diode laser array 16 is monitored using a CCD-camera 28 and associated optical system which utilizes a camera focusing lens 30 to collect the backscattered radiation (depicted as rays 32) from the surface of the diode-laser array 16. This camera 28 is also used to measure the near-field intensity distribution of the diode array emission. An off-axis mirror 34 located near the laser focusing lens 14 (orthogonal to the diode-array junction) directs a portion of the diode-array emission to a silicon photodiode-array 36 (512 elements with 50-micrometers spacing) which measures the far-field angular distribution of the array output.

The spectral distribution of the diode-array 16 output is measured with the ¼ meter monochromator spectrometer 22 and the series of scanning Fabry-Perot interferometers 20 (375-GHz, 15-GHz, and 150-MHz free-spectral range).

The diode laser arrays 16 used for carrying out the invention are commercial ten-element gain-guided devices (Spectra Diode Labs, Model SDL-2410-D1, 6-micrometer stripe width and 10-micrometer center-to-center spacing) which operate at the 100-mW continuous wave level with a center wavelength near 815 nm. The devices are mounted on a thermoelectrically cooled stage (not shown) which permits translation along these orthogonal axes and rotation about two of these axes.

It should be noted that, although discrete components comprising the laser array and light directing optics are shown in FIG. 2, the components may alternatively be provided in the form of an integrated optical circuit.

During experimentation using the system of FIG. 2, the dependence of the optical injection-locking on the input injection angle was examined. The injection angle was varied in the range (+) or (−) 5 degrees to the array axis. However, no strong angular dependence was observed, and all the measurements disclosed herein were made with an injection angle along the array axis.

Figures 3B, 3D:
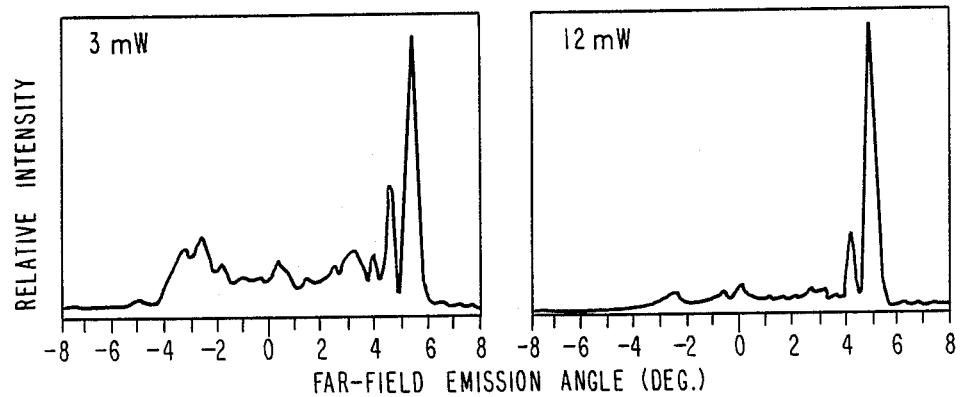

FIG. 3 shows the far-field angular distribution of the diode-laser array 16 operating at the 100-mW level (360-mA current, 1.49xI(threshold)) for various injection power levels. In the free-running mode (i.e. no injected power), the far-field emission consists of two broad lobes centered near (+) or (−) 4 degrees from normal. FIGS. 3B-3D show the narrow single-lobed far-field distribution which is produced when a single end-element of the diode-laser array 16 is injected end-on (along the array axis) at a wavelength corresponding to the higher frequency end of a free-running longitudinal mode cluster. It should be noted that the emission angle (from normal) of the single-lobed far-field beam is slightly larger than that of the free-running emission. Furthermore, the single-lobed emission is directed away from the end-element which is being injected.

As shown in FIG. 3D with an injection power of 12 mW (measured at the diode facet), the angular width of the far-field emission is measured to be 0.43 degrees (full-width at half-maximum). Under these conditions, the output power of the array is increased by 10-15% from its free-running 100 mW level. The diameter of the focussed injection-beam on the diode-laser array facet ($1/e^2$ intensity points, where the letter "e" is the universally accepted designator for the base for natural logarithms and is a constant of value e-2,718) was measured to be slightly less than 5 microns, and the coupling efficiency into the diode array is estimated to be about 20%.

Numerical modeling of the injection-locking process indicates that the single-lobed emission is very similar in nature to that produced by chirping the gain of the array. In the present case, injection of radiation into an end-channel leads to a tilting of the phase fronts emanating from the individual elements which in turn produces an off-axis single-lobed far-field pattern radiated at an angle slightly larger than that which characterizes one of the free-running lobes.

Figure 4:
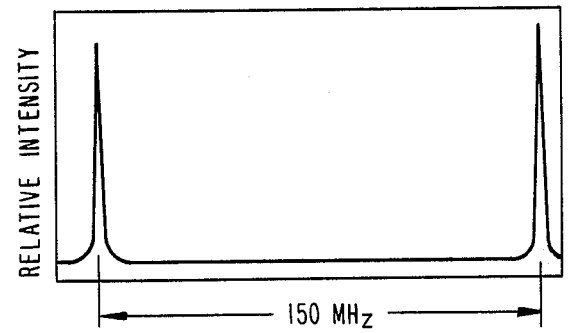
FIG. 4 is a graph depicting a spectral distribution of an injection-locked semiconductor laser array with 12 mW injected power.

The high degree of spectral purity which is characteristic of the optical injection-locked semiconductor laser array of the invention is seen in the scanning Fabry-Perot interferometer graph shown in FIG. 4. Here the less than 2 MHz bandwidth of the emitted radiation is characteristic of the spectral width of the injected radiation and is more than an order of magnitude narrower than that observed previously using a diode-laser master oscillator in Goldberg et al discussed above.

The frequency range over which the diode-array 16 could be locked was measured at various injection power levels. As in Goldberg, et. al., the degree of locking was determined by measuring the peak intensity of the single-lobed output beam. The locking range was defined as the frequency range corresponding to the half-power points of the single-lobed far-field beam. These results are plotted in FIG. 5. Examination of the results for the 3 mW injection power level shows that locking occurs at a number of distinct frequency intervals with maxima separated by approximately 10 GHz (0.22 Å). This frequency spacing is consistent with the spacing of the high-order supermodes observed in high-resolution spectra of free-running diode-laser arrays. A number of asymmetric locking ranges are observed with the single-lobe peak intensity increasing abruptly on the low-frequency side of each locking range and decreasing more gradually on the high-frequency side. This asymmetric behavior has also been observed in injection-locking studies of single-element laser diodes and has been attributed to the carrier density dependent index of refraction in the active region of diode lasers.

Figure 5:
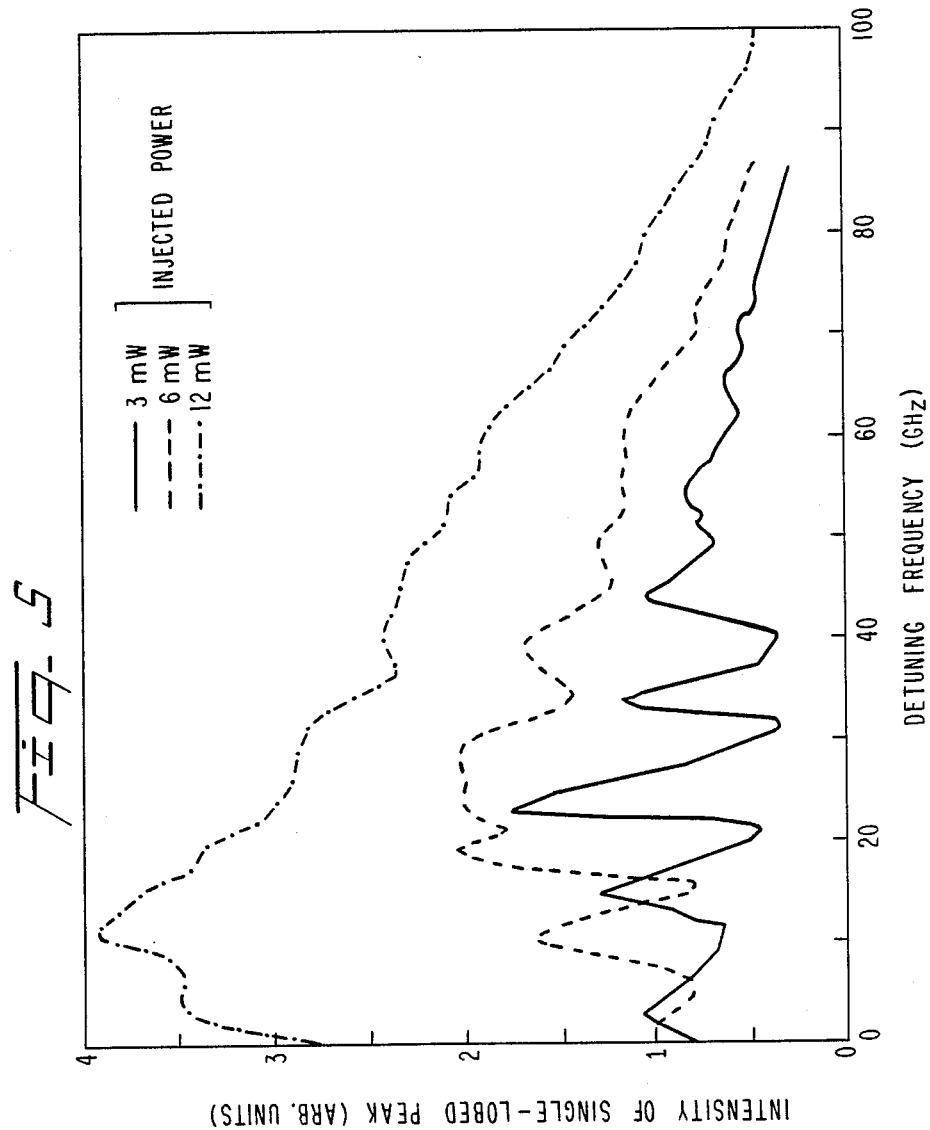
FIG. 5 is a graph depicting variation of single-lobe peak intensity with frequency detuning for injection-locked array operating at 1.49 X I(threshold)

In FIG. 5, a locking range of approximately 6 GHz (FWHM) is observed for the strongest intensity peak at the 3 nW injection level. As the injected power level is increased, the peak of this strongest locking range shifts to lower frequency with a square-root power dependence, as observed in single-stripe diode lasers.

With 6 mW of injected power, the individual locking ranges begin to overlap; and at the 12 mW level a continuous locking range of over 60 GHz is observed.

Figure 6:
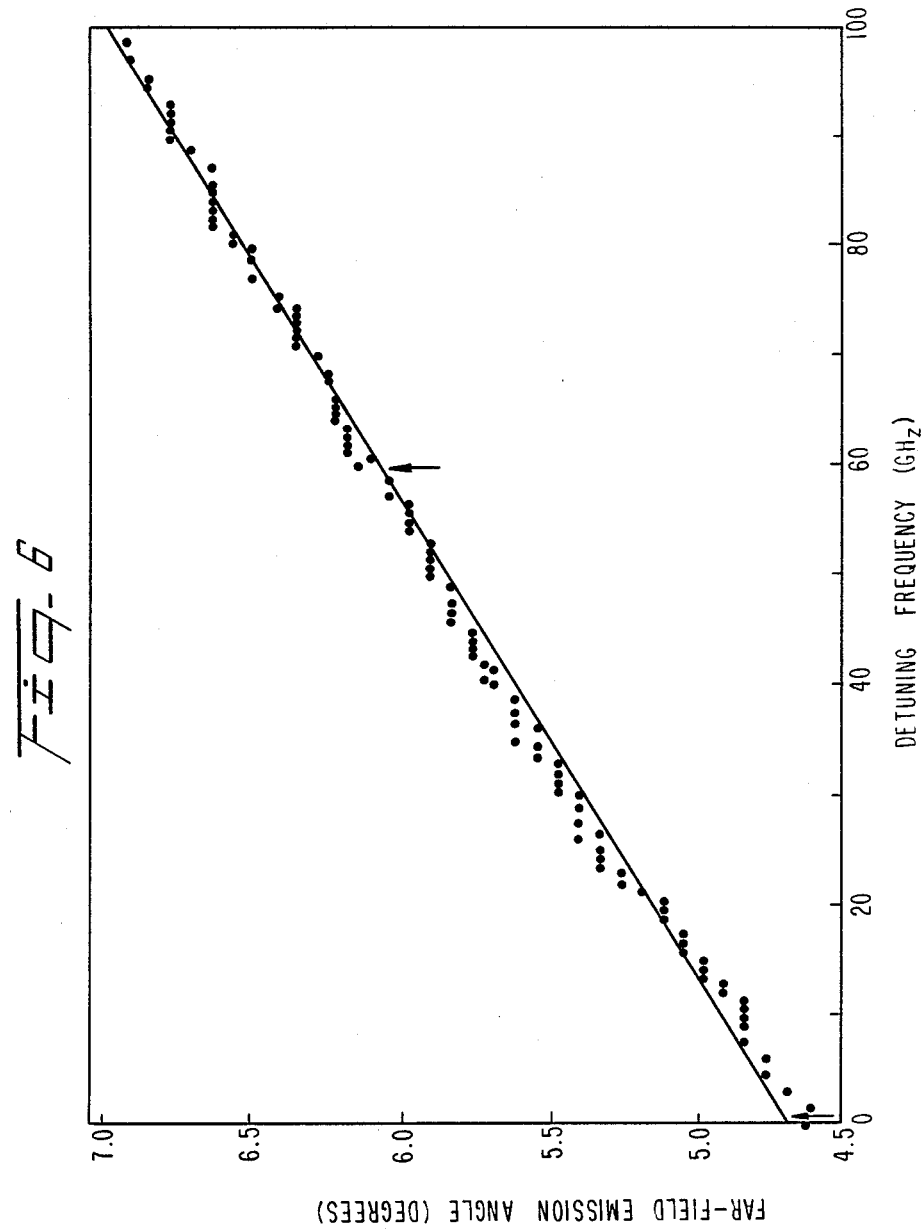
FIG. 6 is a graph depicting variation of far-field beam angle with detuning frequency at 1.49 X I(threshold) and 12 mW injected power.

In addition to examining the effect of injection frequency on locking characteristics, an examination of the effect of injection frequency on the far-field emission was conducted. At a 12 mW injection level, the far-field beam angle (emission angle from normal) is observed to increase linearly from 4.7 degrees to 7.0 degrees as the injection frequency is scanned over 100 GHz (see FIG. 6). This corresponds to an angular tuning rate of $2.3 \times 10^{-2}$ degrees/GHz (1.04 degrees/Å). At the half-intensity points of the locking range, (indicated by vertical arrows in FIG. 6), the total scan angle is 1.39 degrees.

The observed change in the far-field beam angle with injection frequency is consistent with our current understanding of the injection-locking process. Any change in the resonance conditions for the injected radiation produces a corresponding change in the phase-fronts emanating from the individual channels in the array. We have verified this by varying the diode-array injection current while maintaining a constant wavelength for the injected beam. As the injection current was decreased from the normal operating current, 360 mA ($1.49 \times I$ (threshold)), to 299 mA ($1.23 \times I$(threshold)), we observed a decrease in the far-field beam angle of about one degree.

Our study of single-element injection locking of diode laser arrays reveals behavior not previously observed for single-stripe diode lasers. The occurrence of a number of discrete natural frequencies, presumably due to the existence of supermodes, provides a multitude of locking ranges which, at high injection power levels, can be merged into a continuum covering many tens of gigahertz. Furthermore, the angle of the far-field single-lobed output beam can be scanned over a range of several degrees by varying the injection wavelength thus demonstrating the possibility for active optical control of diode-laser arrays.

Thus, in accordance with the principles of the invention described heretofore, at an injection power level of 12mW, mode control of a ten-element diode array is obtained by single-channel injection locking over a frequency locking bandwidth of 60 GHz at half-power levels while maintaining a single-lobe far-field emission beam. This power dependent locking bandwidth is a factor of 80 greater than previously demonstrated for single-channel injection locking of similar diode-laser arrays.

By varying the optical injection frequency over the 60 GHz frequency locking range, the single-lobed far-field beam emitted by the array can be scanned over an angle of 1.39 degrees at a rate of $2.3 \times 10^{-2}$ degrees/GHz (1.04 degrees/Angstrom). Larger angle scans (up to 2.3 degrees) are also obtainable with a reduction in the single-lobe power with increasing angle by the subject method and apparatus for laser beam steering by injection-locking.

The angular scanning observed with single-channel injection-locking is largely independent of the optical injection power. The scanning rate (degrees/GHz) varies by only 10% as the injected power is varied by a factor of four. This relationship between injection power and scanning rate seems to indicate that the mechanism for the angular scanning is not gain saturation in the semiconductor array, but rather the change in the phase-fronts of the optical waves propagating in the array due to the presence of the injected wave.

Angle scanning of the diode-laser array is accomplished electronically by maintaining a fixed optical injection frequency from the master oscillator and varying the electric current supplying the diode-laser array. In this case, a change in the diode-laser current of 61 mA (from 299 mA to 360 mA) increases the emission angle of the single-lobed far-field beam by approximately one degree.

In the present case, a single end-element of a diode laser array is optically injected along the array axis. In this manner, the array is forced to emit in a single beam. Furthermore, with this method, the phase tilt across the entire array can be controlled and varied simply by changing the frequency of the injected radiation. Under these conditions the locking range is 60 GHz, and the array emission beam can be scanned linearly with injection frequency over an angle of 2.3 degrees.

The injection-locking technique of the invention is applicable to one-dimensional diode-laser arrays of arbitrary dimensions and also to two-dimensional arrays. The technique of the invention has been demonstrated with a stripe-geometry gain-guided diode-laser array. The techniques of the invention are believed to be applicable to arrays of other construction (e.g. broad-area arrays, index-guided arrays, etc.) thereby providing a means for directly controlling the spatial and spectral emission characteristics of these arrays and also scanning the output beam from the arrays. It is expected that the optical and/or electronic scanning capability afforded by injection-locking techniques of the invention will play an essential role in the development of large scale diode arrays for commercial and military applications.

Numerous additional benefits are obtained by employing the principles of the invention. For example, with the invention, beam steering of a diode-laser array occurs primarily from the injection of an optical beam into the array rather than by electronic means (although electronic scanning is also possible and has been disclosed). This use of optical scanning allows for scanning at much faster speeds than is possible with electronic scanning. In addition, the subject invention is not limited to scanning at a fixed frequency.

With the invention, the laser beam control and scanning apparatus is vastly simpler and more compact than the prior art since it utilizes the active gain medium of a closely coupled diode laser array to act both as a source of high power laser radiation and also as the phase modulator required to steer the emission angle of the laser radiation. The simplicity and direct integration achieved with the subject invention eliminates the separate phase modulators and/or frequency shifters required in the prior art.

Further, the relative phases of the various emitters required to cause the lasing beam to be emitted at a given angle are automatically and efficiently achieved by the use of a single input laser beam from a master oscillator injected into a single end-element of a multiple-element array. In order to scan the emission angle of the diode array output beams, a change in the frequency of the master oscillator is all that is required. Thus with the invention, the multiple input beams and the associated mirrors or optical distributors required to generate them, as required in the prior art U.S. Pat. No. 3,626,321 to Smith and U.S. Pat. No. 3,691,483 to Klein are eliminated.

In addition, with the invention, the use of a single input beam allows the number of lasing elements in the scanned laser array to be changed at will without necessitating any change in the control apparatus (master oscillator and input beam optics). Thus, scaling of the diode laser array to a very large number of emitting elements (in the form of a one- or two-dimensional array) requires only one or at the most a very few master oscillators to control the performance of the array. This scaling would be very difficult and costly, if not impossible, with the prior art.

Furthermore in accordance with the invention, a single, nearly-diffraction-limited laser beam is generated by the injection-locked diode laser array. The spatial intensity profile of this beam is relatively insensitive to the angle of emission of the beam. These characteristics are desirable in order to concentrate the emitted laser power into an intense beam which can be used for any number of applications.

Another benefit of the invention is that it can be implemented as a single compact unit in the form of an integrated optical circuit.

Still another benefit resulting from employing the principles of the invention is that a conventional two-lobed far-field beam pattern is converted to a single narrow beam having a near-diffraction-limited angular width in the dimension of the array. These benefits are accomplished with no reduction in the total output power of the diode-laser array.

The foregoing description of the invention has been presented for purposes of illustration and description. It is not intended to be exhaustive or to limit the invention to the precise form disclosed. Obvious modifications or variations are possible in light of the above teachings, for example, as described in the detailed description of FIG. 2.

What is claimed is:

1. A steerable beam semiconductor laser apparatus, comprising:
   an array of semiconductor laser elements,
   a variable frequency optical energy source, and
   means for directing optical energy from said optical energy source along the axis of said array onto one end element of said array of semiconductor laser elements to lock said array into a desired spatial and spectral laser emission.

2. An apparatus described in claim 1 wherein said semiconductor array is a diode laser array.

3. An apparatus described in claim 2 wherein said semiconductor array is a stripe-geometry gain-guided diode-laser array.

4. An apparatus described in claim 1 wherein said optical energy source comprises a continuous wave laser.

5. An apparatus described in claim 1 wherein said optical energy source comprises a pulsed wave laser.

6. An apparatus described in claim 4 wherein said continuous wave laser is a dye laser.

7. An apparatus as in claim 1, wherein said optical energy source comprises a semiconductor diode laser.

8. An apparatus as in claim 1, wherein said optical energy source comprises a color center laser.

9. An apparatus as in claim 1, wherein said directing means comprises an optical waveguide.

10. An apparatus described in claim 1 wherein said means for directing optical energy from said optical energy source to said array of semiconductor laser elements is a focusing lens.

11. A method of steering an optical injection locked laser beam generated from an array of semiconductor elements, comprising the step of varying an optical injection frequency applied to one end element in said semiconductor array.

12. A method of steering an optical laser beam generated from an array of semiconductor elements, comprising the steps of:
    maintaining a fixed optical injection frequency from a master oscillator to one end element of said array of semiconductor elements, and
    varying the electric current supplying the semiconductor laser array.

13. An apparatus described in claim 1 wherein the output frequency of said array is locked into a single longitudinal mode.

* * * * *